United States Patent
Ye

(10) Patent No.: US 9,936,584 B2
(45) Date of Patent: Apr. 3, 2018

(54) PRINTED CIRCUIT BOARD, WATERPROOF MICROPHONE AND PRODUCTION PROCESS THEREOF

(71) Applicants: ZILLTEK TECHNOLOGY (SHANGHAI) CORP., Shanghai (CN); ZILLTEK TECHNOLOGY CORP., Hsinchu (TW)

(72) Inventor: Jinghua Ye, Shanghai (CN)

(73) Assignees: ZILLTEK TECHNOLOGY (SHANGHAI) CORP.; ZILLTEK TECHNOLOGY CORP.

( * ) Notice: Subject to any disclaimer, the term of this patent is extended or adjusted under 35 U.S.C. 154(b) by 52 days.

(21) Appl. No.: 14/937,076

(22) Filed: Nov. 10, 2015

(65) Prior Publication Data
US 2016/0366767 A1  Dec. 15, 2016

(30) Foreign Application Priority Data

Jun. 9, 2015  (CN) .......................... 2015 1 0313769

(51) Int. Cl.
*H04R 3/00* (2006.01)
*H05K 3/00* (2006.01)
(Continued)

(52) U.S. Cl.
CPC ............. *H05K 3/0058* (2013.01); *H04R 1/44* (2013.01); *H05K 1/0298* (2013.01);
(Continued)

(58) Field of Classification Search
CPC .. H05K 3/0058; H05K 3/4644; H05K 1/0298; H05K 2201/09063; H04R 1/44; H04R 2201/003; H04R 2231/003
(Continued)

(56) References Cited

U.S. PATENT DOCUMENTS

2006/0191586 A1* 8/2006 Cheng .................. B29D 23/001
                                                            138/127
2010/0261321 A1* 10/2010 Hirano ................ H01L 51/0097
                                                            438/158
(Continued)

FOREIGN PATENT DOCUMENTS

CN        203722818        7/2014
CN        203813960        9/2014

*Primary Examiner* — William A Jerez Lora
(74) *Attorney, Agent, or Firm* — Terry M. Sanks, Esq.; Beusse Wolter Sanks & Maire, PLLC

(57) ABSTRACT

The present invention relates to the field of voice signal collecting device, more specifically, to a PCB, a waterproof microphone and a production process thereof. A waterproof microphone, comprising: a first PCB; a second PCB, stacked along two parallel ends of the first PCB; a third PCB, configured with an acoustics through-hole and located at an upper end of the second PCB; wherein, an acoustics cavity is formed at a space surrounded with the first PCB, the second PCB and the third PCB; the third PCB is formed by a plurality of substrate; each of the substrates is configured with an through-hole at same location and with same shape; an opening is formed on the PCB by interconnecting the through-holes; between every two adjacent ones of the substrate, a waterproof membrane is configured. The waterproof performance of the waterproof membrane is better, and the efficiency of the attachment is higher.

6 Claims, 2 Drawing Sheets

(51) Int. Cl.
*H05K 1/02* (2006.01)
*H05K 3/46* (2006.01)
*H04R 1/44* (2006.01)

(52) U.S. Cl.
CPC ..... *H05K 3/4644* (2013.01); *H04R 2201/003* (2013.01); *H05K 2201/09063* (2013.01)

(58) Field of Classification Search
USPC ........ 381/111, 113, 150, 174, 175, 190, 191, 381/355, 369, 398; 257/265, 334, 337, 257/476, 479, 710
See application file for complete search history.

(56) References Cited

U.S. PATENT DOCUMENTS

2011/0255721 A1\* 10/2011 Chen ..................... H04R 19/01
381/191
2012/0087521 A1\* 4/2012 Delaus ................ B81C 1/00238
381/174
2015/0243582 A1\* 8/2015 Klewer ................. H01L 23/481
257/368
2017/0048625 A1\* 2/2017 Salmon .................... B81B 3/00

\* cited by examiner

PRINTED CIRCUIT BOARD, WATERPROOF MICROPHONE AND PRODUCTION PROCESS THEREOF

TECHNICAL FIELD

The present invention relates to the field of voice signal collecting device, more specifically, to a PCB, a waterproof microphone and a production process thereof.

BACKGROUND OF THE INVENTION

Micro-electromechanical Systems (MEMS) Microphone is produced on the basis of MEMS technology. The MEMS microphone is small in size, and has an improved noise elimination performance and good RF and EMI inhibiting ability, which is mainly used for middle-end and high-end mobile terminals.

The MEMS microphone of the prior art comprises a PCB, on which it is configured with a MEMS sensor, an ASIC chip. A cover is arranged on the MEMS sensor and the ASIC chip. The cover covers the MEMS sensor and ASIC chip completely, and forms an acoustics cavity with the PCB. The cover has an acoustics through-hole, by which the outside voice message is acquired, but the MEMS microphone produced by such way does not have waterproof function. To overcome such defect, the MEMS is usually treated by attaching membranes. The way to attach the membrane mainly includes the following two methods. The first comprises the following steps: configuring a layer of waterproof membrane on the outside of the cover; generally, arranging the MEMS sensor and ASIC chip on the PCB via surface mounted technology (SMT) at first; then covering the PCB by using the cover, and carrying out the process of attaching membrane at last; such manufacturing technique is quite complicated, and poor in waterproof. The second comprises the steps of attaching a waterproof membrane onto the inside of the cover, which increases the complexity of the processes greatly; during the operation, it needs to open the cover first; next, carry out the process of the applying membrane; then turn over the cover and cover other elements; the technological process is complicated and the production efficiency is low.

SUMMARY OF THE INVENTION

In view of the disadvantages in the prior art, the present invention provides a PCB (Printed Circuit Board), a waterproof microphone and a production process thereof, which is good at waterproof and easy to achieve.

The technical schemes of the present application are listed as follows:

A PCB, applied to the production of microphone, wherein the PCB board is formed by stacking a plurality of substrates; each of the substrates is configured with a through-hole at same location and with same shape; an opening is formed on the PCB by interconnecting the through-holes; between every two adjacent ones of the substrate, a waterproof membrane is configured.

In the above PCB, the waterproof membrane is configured by printing technology.

A waterproof microphone, applied to collection of voice signals, comprising:

a first PCB;

a second PCB, stacked along two parallel ends of the first PCB;

a third PCB, configured with an acoustics through-hole and located at an upper end of the second PCB;

wherein, an acoustics cavity is formed at a space surrounded with the first PCB, the second PCB and the third PCB; the third PCB is formed by a plurality of substrate; each of the substrates is configured with an through-hole at same location and with same shape; an opening is formed on the PCB by interconnecting the through-holes; between every two adjacent ones of the substrate, a waterproof membrane is configured.

In the above PCB, the second PCB is located at ends that are parallel to each other in a vertical direction of the first PCB.

In the above PCB, the waterproof membrane is configured by printing technology.

In the above PCB, the third PCB is laminated by the plurality of substrates.

In the above PCB, the waterproof membrane is a heat-proof waterproof cloth.

In the above PCB, the waterproof membrane is a silicon base waterproof membrane.

In the above PCB, a thickness of the silicon substrate is selected from 0.1 μm to 0.15 μm.

A production process of a waterproof microphone, applied to collection of voice signals, comprising:

Step 1, providing a first PCB;

Step 2, providing a third PCB formed by a plurality of substrates, and providing a waterproof membrane between every two adjacent ones of the substrates of the third PCB;

Step 3, stacking a second PCB along two ends of the first PCB;

Step 4, stacking the third PCB on the second PCB to form an acoustics cavity surrounded by the first PCB, the second PCB and the third PCB.

Compared with the prior art, the advantages of the present invention are:

(1) waterproof membranes are attached to the PCB by printing processes, which is easy to perform and does not need any additional procedure. Therefore, the production efficiency is higher, and the waterproof performance is better;

(2) for the waterproof microphone, the third PCB is formed by a plurality of substrate; each of the substrates is configured with an through-hole at same location and with same shape; an opening is formed on the PCB by interconnecting the through-holes; between every two adjacent ones of the substrate, a waterproof membrane is configured; through the configuration of the waterproof membrane on the inside of the third PCB, the waterproof performance is better, and, additionally, the printing technology is used for the attachment of the waterproof membrane, so the efficiency of the attachment is higher.

BRIEF DESCRIPTIONS OF THE DRAWINGS

DETAILED DESCRIPTION

It is described clearly and entirely for the technical solution of the invention with the accompanying drawings. Obviously, the described embodiments of the invention are part of the embodiments. Based on the embodiments of the invention, all the other embodiments obtained by the people skilled in the art without creative efforts fall in the scope of the invention.

It is noted that the embodiments and the features thereof can be combined with each other without conflicting.

It is described clearly and entirely for the technical solution of the invention with the accompanying drawings.

A PCB, applied to the production of microphone, wherein the PCB board is formed by stacking a plurality of substrates; each of the substrates is configured with an through-hole at same location and with same shape; an opening is formed on the PCB by interconnecting the through-holes; between every two adjacent ones of the substrate, a waterproof membrane is configured.

In the above PCB, the waterproof membrane is configured by printing technology.

Figure 1:
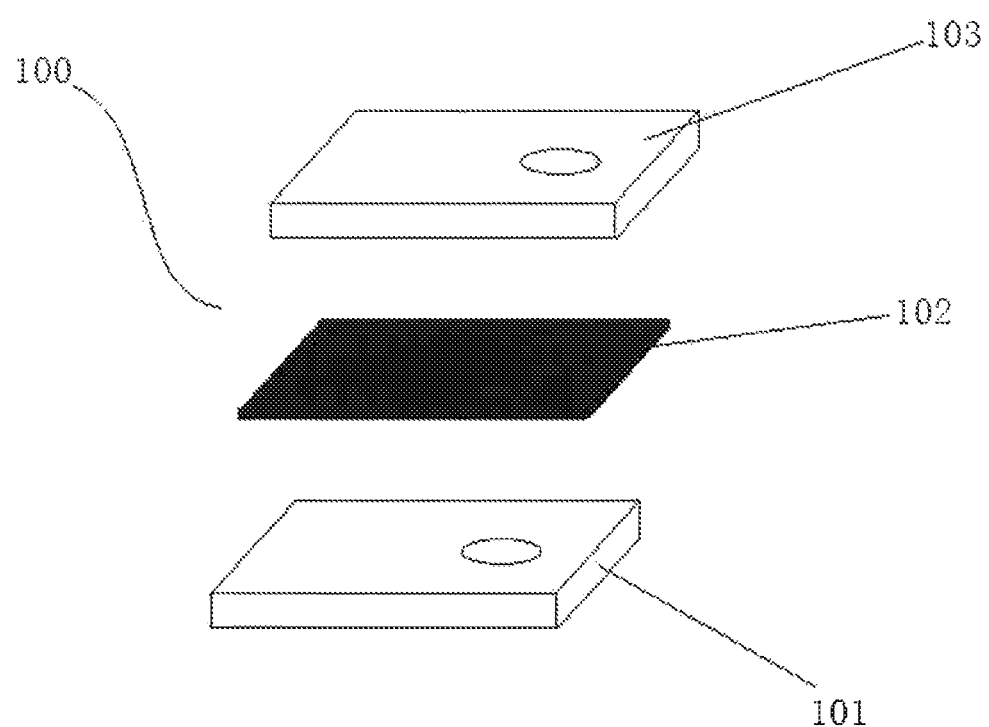
FIG. 1 is a structure diagram of an embodiment of a PCB according to the present invention.

In one embodiment of the present invention, as shown in FIG. 1, the PCB 100 includes a plurality of substrate. In an example that the PCB includes two substrate, fix the bottom substrate 101 on the desired location; configure a waterproof membrane 102, which transmits sound and is impervious, on the bottom substrate 101; fix the top substrate 103 on the waterproof membrane 102; match the through-hole of the top substrate 103 with the through-hole of the bottom substrate 101 to form an opening; finally, laminate the PCB 100. Further, the printing technology is used for the attachment of the waterproof membrane 102, of which the production process is easy since no additional procedure is needed, and the production efficiency is higher, and the waterproof performance is better.

Figure 2:
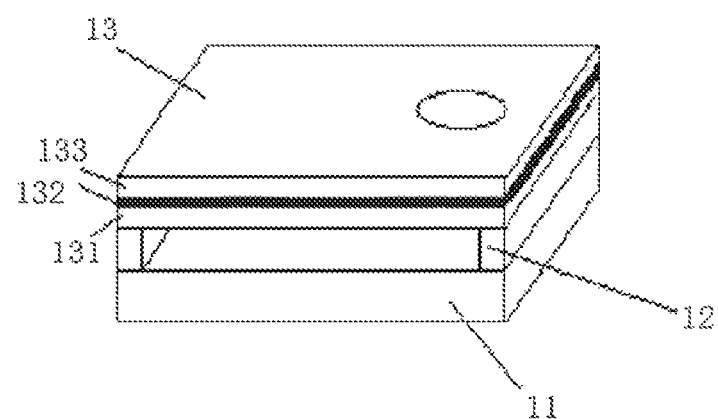
FIG. 2 is a structure diagram of a waterproof microphone according to an embodiment of the invention.

As shown in FIG. 2, the present invention also provides a waterproof microphone, applied to collection of voice signals, comprising:

a first PCB 11;

a second PCB 12, stacked along two parallel ends of the first PCB 11;

a third PCB 13, configured with an acoustics through-hole and located at an upper end of the second PCB 12;

wherein, an acoustics cavity is formed at a space surrounded with the first PCB 11, the second PCB 12 and the third PCB 13; the third PCB 13 is formed by a plurality of substrate; each of the substrates is configured with an through-hole at same location and with same shape; an opening is formed on the PCB by interconnecting the through-holes; between every two adjacent ones of the substrate, a waterproof membrane 133 is configured.

The operating principle of the present invention is:

The waterproof microphone is formed by stacking three PCBs, the second PCB 12 is stacked along the two ends of the first PCB 11 which are parallel to each other; the third PCB 13 is provided on the upper end of the second PCB 12; therefore, an acoustics cavity is formed at the place surrounded by the first PCB 11, the second PCB 12 and the third PCB 13; the third PCB 13 is formed by a plurality of substrates, each of the substrates is configured with an through-hole at same location and with same shape. An acoustics opening is formed by stacking and interconnecting the plurality of the through-holes; a waterproof membrane 133 is configured between every two adjacent substrates. By the configuration of the waterproof membrane 133 on the inside of the third PCB 13, the waterproof performance is better, and, additionally, the printing technology is used for the attachment of the waterproof membrane 133, and the efficiency of the attachment is higher.

In one embodiment of the invention, as shown in FIG. 2, the third PCB 13 comprises two substrates, which are a first substrate 131 and a second substrate 133. Fix the first substrate 131 on the desired location; configure a waterproof membrane 132, which transmits sound and is impervious, on the first substrate 131; fix the second substrate 133 on the waterproof membrane 132; match the through-hole of the first substrate 131 with the through-hole of the second substrate 133 to form an opening; finally, laminate the third PCB 13.

In the above mentioned waterproof microphone, the second PCB 12 is located at ends that are parallel to each other in a vertical direction of the first PCB 11. Generally, the length of the vertical direction of the first PCB 11 is shorter than the length of the horizontal direction of the first PCB 11, and by configuring the second PCB 12 in the vertical direction of the first PCB 11, the acoustics cavity which is surrounded by the first PCB 11, the second PCB 12 and the third PCB 13 is larger, which increase the range of the collection of the voice signal for the microphone.

In the above mentioned waterproof microphone, the waterproof membrane 133 is configured by printing technology. By using the printing technology, the efficiency is higher.

In the above mentioned waterproof microphone, the third PCB 13 is laminated by a plurality of the substrates. The laminating technology which forms the third PCB 13 makes the bonding between each substrate more secure.

In the above mentioned waterproof microphone, the waterproof membrane 133 is a heatproof waterproof cloth, which enables the microphone to work within a high temperature environment.

In the above mentioned waterproof microphone, the waterproof membrane 133 is a silicon base waterproof membrane 133. The thickness of the silicon base waterproof membrane 133 is selected from 0.1 µm to 0.15 µm. By using the silicon base waterproof membrane 133, its waterproof performance gets better and the thickness is reduced, which has the benefits to integration and thinning.

A production process of a waterproof microphone, applied to collection of voice signals, comprising:

Step 1, providing a first PCB;

Step 2, providing a third PCB formed by a plurality of substrates, and providing a waterproof membrane between every two adjacent ones of the substrates of the third PCB;

Step 3, stacking a second PCB along two ends of the first PCB;

Step 4, stacking the third PCB on the second PCB to form an acoustics cavity surrounded by the first PCB, the second PCB and the third PCB.

The detailed description of a production process of a waterproof microphone is similar to the waterproof microphone mentioned above, and unnecessary to be repeated again.

The description listed above is detailed description of embodiments of the invention. It should be understood that the invention is not limited by the above embodiments. Any changes and modifications of the invention fall in the scope of the application for the skilled in the art. Therefore the changes and modifications made without departing from the spirit and scope of the invention fall in the scope of the invention.

What is claimed is:

1. A PCB (Printed Circuit Board), applied to the production of a microphone, wherein the PCB is formed by stacking a plurality of substrates; each of the substrates is configured with a through-hole at same location and with a same shape; an opening is formed on the PCB by interconnecting the through-holes; between every two adjacent ones of the substrate, only a waterproof membrane is configured, the waterproof membrane is configured by printing technology; the waterproof membrane is a silicon base waterproof membrane; thickness of the silicon base waterproof membrane is selected from 0.1 µm to 0.15 µm.

2. A waterproof microphone, applied to collection of voice signals, comprising:
- a first PCB;
- a second PCB, stacked along two parallel ends of the first PCB; and
- a third PCB, configured with an acoustics through-hole and located at an upper end of the second PCB;
- wherein, an acoustics cavity is formed at a space surrounded with the first PCB, the second PCB and the third PCB; the third PCB is formed by a plurality of substrate; each of the substrates is configured with through-hole at same location and with same shape; an opening is formed on at least the third PCB by interconnecting the through-holes; between every two adjacent ones of the substrate, only a waterproof membrane is configured, the waterproof membrane is configured by printing technology; the waterproof membrane is a silicon base waterproof membrane; thickness of the silicon base waterproof membrane is selected from 0.1 µm to 0.15 µm.

3. The waterproof microphone of claim 2, wherein the second PCB is located at ends that are parallel to each other in a vertical direction of the first PCB.

4. The waterproof microphone of claim 2, wherein the third PCB is laminated by the plurality of substrates.

5. The waterproof microphone of claim 2, wherein the waterproof membrane is a heatproof waterproof cloth.

6. A production process of a waterproof microphone, applied to collection of voice signals, comprising:
- Step 1, providing a first PCB;
- Step 2, providing a third PCB formed by a plurality of substrates, and providing only a waterproof membrane between every two adjacent ones of the substrates of the third PCB, a printing technology is used for the attachment of the waterproof membrane; the waterproof membrane is a silicon base waterproof membrane; thickness of the silicon base waterproof membrane is selected from 0.1 µm to 0.15 µm;
- Step 3, stacking a second PCB along two ends of the first PCB; and
- Step 4, stacking the third PCB on the second PCB to form an acoustics cavity surrounded by the first PCB, the second PCB and the third PCB.

* * * * *